United States Patent
Kulitzki et al.

(10) Patent No.: US 9,298,111 B2
(45) Date of Patent: Mar. 29, 2016

(54) OPTICAL ARRANGEMENT IN A PROJECTION EXPOSURE APPARATUS FOR EUV LITHOGRAPHY

(75) Inventors: Viktor Kulitzki, Zwickau (DE); Bernhard Gellrich, Aalen (DE); Stefan Xalter, Oberkochen (DE); Yim-Bun Patrick Kwan, Aalen (DE); Peter Deufel, Koenigsbronn (DE); Andreas Wurmbrand, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 855 days.

(21) Appl. No.: 13/405,882

(22) Filed: Feb. 27, 2012

(65) Prior Publication Data

US 2012/0188523 A1    Jul. 26, 2012

Related U.S. Application Data

(63) Continuation of application No. PCT/EP2010/064198, filed on Sep. 24, 2010.

(30) Foreign Application Priority Data

Sep. 30, 2009  (DE) .......................... 10 2009 045 223

(51) Int. Cl.
  *G03B 27/52* (2006.01)
  *G03B 27/54* (2006.01)
  (Continued)

(52) U.S. Cl.
  CPC .............. *G03F 7/70916* (2013.01); *G02B 7/00* (2013.01); *G03F 7/70233* (2013.01); *G03F 7/70808* (2013.01); *G03F 7/70825* (2013.01); *G03F 7/70891* (2013.01)

(58) Field of Classification Search
  CPC ........ G02B 7/021; G02B 7/18; G02B 7/1815; G02B 17/182; G02B 17/195; G03F 7/70233; G03F 7/70808; G03F 7/70825; G03F 7/70833; G03F 7/70891; G03F 7/70883; G03F 7/70916
  USPC ........................ 355/30, 52, 53, 55, 67–71, 77; 250/492.1, 492.2, 492.22, 493.1, 548; 359/819–821, 849, 850–866
  See application file for complete search history.

(56) References Cited

U.S. PATENT DOCUMENTS

| 5,638,223 A | 6/1997 | Ikeda |
| 6,449,106 B1 | 9/2002 | Spinali |

(Continued)

FOREIGN PATENT DOCUMENTS

| CN | 100422855 C | 10/2008 |
| DE | 10 2006 044 591 | 4/2008 |

(Continued)

OTHER PUBLICATIONS

The German Office Action for corresponding DE Appl No. 10 2009 045 223.0-51, dated Jul. 21, 2010.

(Continued)

*Primary Examiner* — Christina Riddle
(74) *Attorney, Agent, or Firm* — Fish & Richardson P.C.

(57) ABSTRACT

An optical arrangement includes a multiplicity of optical elements and a carrier structure which carries the optical elements. The carrier structure is composed of at least two releasably interconnected modules. Each module is composed of at least one carrier structure subelement. A subhousing is produced by a multiplicity of carrier structure subelements and/or modules. The subhousing has a geometry that varies, at least in regions, in correspondence to a usable beam path in the projection exposure apparatus, the usable beam path being defined as an envelope of all light bundles which can propagate from all field points in a field plane to an image plane of the projection exposure apparatus. A projection exposure apparatus for EUV lithography includes such an optical arrangement.

27 Claims, 5 Drawing Sheets

(51) Int. Cl.
  *G03B 27/32* (2006.01)
  *G03F 7/20* (2006.01)
  *G02B 7/00* (2006.01)

(56) References Cited

U.S. PATENT DOCUMENTS

| | | | |
|---|---|---|---|
| 6,529,264 B1 | 3/2003 | Ikeda | |
| 6,639,732 B2 | 10/2003 | Omura et al. | |
| 6,750,949 B2 | 6/2004 | Loopstra et al. | |
| 6,757,051 B2* | 6/2004 | Takahashi et al. | 355/67 |
| 7,126,664 B2 | 10/2006 | Luttikhuis et al. | |
| 7,139,065 B2 | 11/2006 | Ono | |
| 7,161,658 B2 | 1/2007 | Franken | |
| 7,282,874 B2 | 10/2007 | Shibata et al. | |
| 7,295,285 B2* | 11/2007 | Hiura | 355/30 |
| 8,018,664 B2 | 9/2011 | Xalter et al. | |
| 2002/0017616 A1* | 2/2002 | Ota | 250/492.1 |
| 2003/0010902 A1 | 1/2003 | Hof et al. | |
| 2004/0051984 A1* | 3/2004 | Oshino et al. | 359/845 |
| 2005/0018154 A1 | 1/2005 | Box et al. | |
| 2005/0083500 A1* | 4/2005 | Franken | 355/53 |
| 2006/0034004 A1* | 2/2006 | Sakamoto | 359/820 |
| 2006/0175993 A1* | 8/2006 | Shibata et al. | 318/135 |
| 2006/0262704 A1* | 11/2006 | Scherle et al. | 369/112.01 |
| 2007/0252959 A1* | 11/2007 | Schwertner | G03F 7/70891 355/30 |
| 2008/0144202 A1* | 6/2008 | Wevers et al. | 359/845 |
| 2008/0198352 A1 | 8/2008 | Kugler et al. | |
| 2008/0291416 A1 | 11/2008 | Nishikawa | |
| 2009/0135386 A1 | 5/2009 | Nishikawa | |
| 2009/0174874 A1 | 7/2009 | Rau et al. | |

FOREIGN PATENT DOCUMENTS

| | | |
|---|---|---|
| EP | 1 278 089 | 1/2003 |
| EP | 1 513 018 | 3/2005 |
| JP | 2003-158070 A | 5/2003 |
| JP | 2005-086207 A | 3/2005 |
| JP | 2005-101456 A | 4/2005 |
| JP | 2006-032953 A | 2/2006 |
| JP | 2006-211812 A | 8/2006 |
| JP | 2007-524129 A | 8/2007 |
| WO | WO 2005/083487 | 9/2005 |
| WO | WO 2005/116773 | 12/2005 |
| WO | WO 2007/086557 | 8/2007 |
| WO | WO 2008/034582 | 3/2008 |

OTHER PUBLICATIONS

International Preliminary Report on Patentability for corresponding PCT Appl No. PCT/EP2010/064198, dated Apr. 12, 2012.
International Search Report and Written Opinion for corresponding PCT Appl No. PCT/EP2010/064198, dated Feb. 16, 2011.
Chinese Office Action, with translation thereof, for corresponding CN Appl 201080043905.7, dated Nov. 26, 2013.
Japanese Office Action, with translation thereof, for corresponding JP Appl No. 2012-530281, dated Jul. 8, 2013.
Chinese Office Action, with translation thereof, for CN Appl No. 201080043905.7, dated Oct. 10, 2014.

* cited by examiner

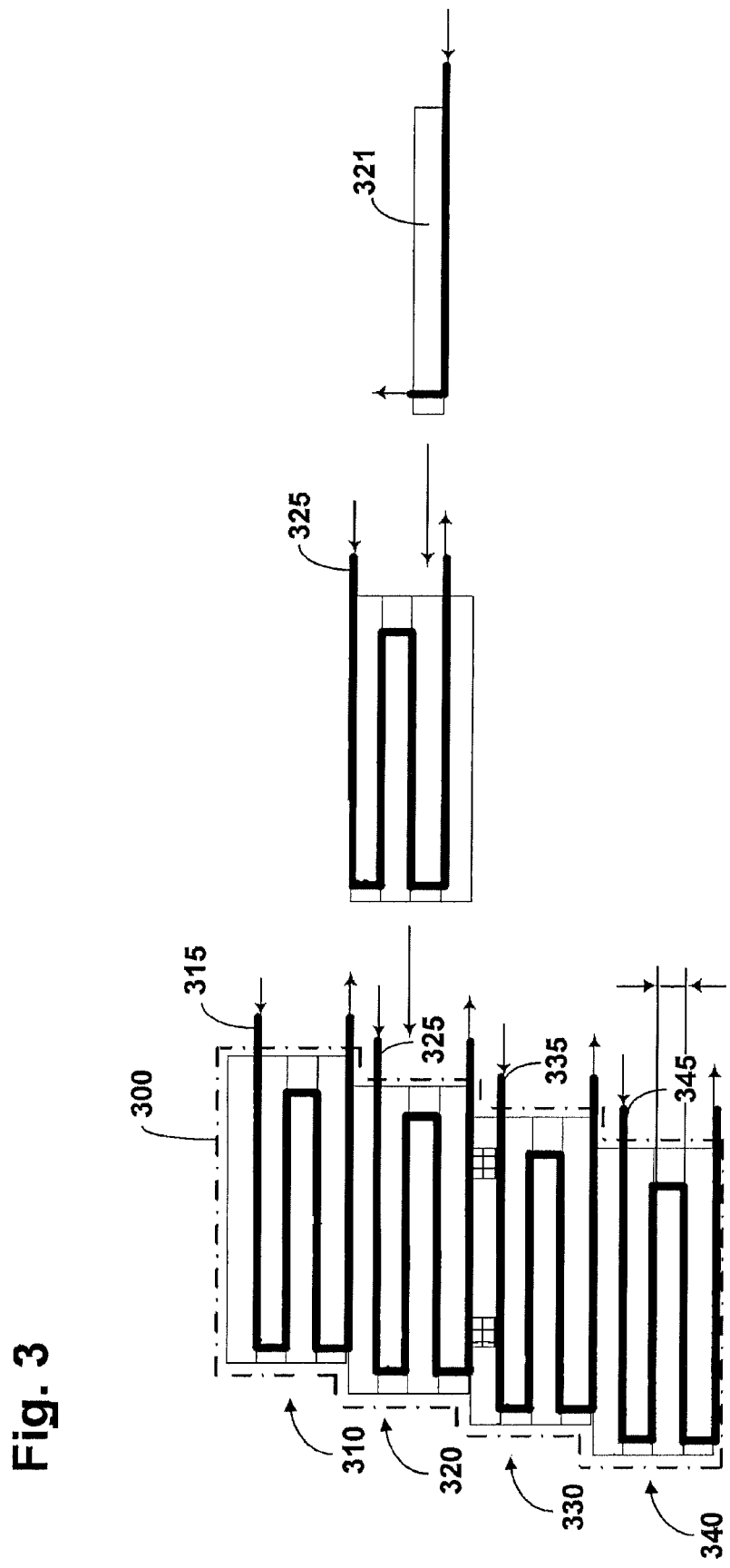

OPTICAL ARRANGEMENT IN A PROJECTION EXPOSURE APPARATUS FOR EUV LITHOGRAPHY

CROSS-REFERENCE TO RELATED APPLICATIONS

This application is a continuation of, and claims benefit under 35 USC 120 to, international application PCT/EP2010/064198, filed Sep. 24, 2010, which claims benefit under 35 USC 119 of German Application No. 10 2009 045 223.0, filed Sep. 30, 2009. International application PCT/EP2010/064198 is hereby incorporated by reference in its entirety.

FIELD

The disclosure relates to an optical arrangement, as well as a projection exposure apparatus for EUV lithography which includes such an optical arrangement.

BACKGROUND

Microlithography is used for the production of microstructured components such as for example integrated circuits or LCDs. The microlithography process is carried out in what is referred to as a projection exposure apparatus which has an illumination system and a projection objective. The image of a mask (=reticle), illuminated via the illumination system, is projected onto a substrate via the projection objective. The substrate (for example a silicon wafer) is coated with a light-sensitive layer (photoresist) and arranged in the image plane of the projection objective in order to transfer the mask structure onto the light-sensitive coating on the substrate.

In projection exposure apparatuses designed for the EUV range (wavelengths of for example about 13 nm or about 7 nm) mirrors are used as optical components for the imaging process due to the general lack of availability of suitable translucent refractive materials. In practice, operation under EUV conditions involves implementing many functionalities and fulfilling demanding desired properties.

The service life of the mirrors or the projection exposure apparatus designed for operation under EUV conditions is usually limited due to contaminating particles or gases, in particular hydrocarbon compounds, so that operation of the projection exposure apparatus is generally performed under vacuum conditions (for example at total pressures of $10^{-3}$ mbars or below). The contaminants which spread in the system can adhere to the surfaces of the optical elements, which in turn results in an adverse effect on the optical properties of the elements such as for example a loss of reflection in respect of the mirrors.

WO 2008/034582 A2 discloses among other things an optical arrangement, in particular a projection exposure apparatus for EUV lithography, which, to reduce the adhesion of contaminants, in particular to reflective optical elements, has within an evacuated housing at least one further vacuum housing surrounding the optical surface of the respective reflective optical element. Associated with the vacuum housing is a contamination reduction unit which reduces the partial pressure of contaminating substances such as water and/or hydrocarbons at least in the immediate proximity of the optical surface. In that way a kind of "mini-environment" is generated around the optical surface, with a reduced number of contaminating particles, so that fewer particles can be deposited on the optical surface.

US 2009/0135386 A1 discloses among other things the provision of a plurality of subchambers in an illumination system of a projection exposure apparatus within a vacuum chamber. The subchambers are separated from each other by way of separating walls provided with a passage opening therethrough and respectively arranged at positions of minimum light cross-sectional area or in the proximity thereof, and respectively evacuated by associated vacuum pumps.

In addition, in operation with globally or locally high levels of light power density, the increase in temperature of the optical elements such as for example mirrors, lenses or holder elements, that is involved with the high light power density and absorption, can result in an adverse effect on the imaging properties of the optical system. An example of this is the adverse effect of temperature-sensitive elements present in the optical system such as for example position sensors. It is known for example in projection objectives designed for the EUV range, in addition to a carrier structure which carries mirrors and mirror actuators, to provide a measurement structure which is typically arranged outside the carrier structure and which is intended to ensure thermally and mechanically stable fixing of position sensors or other measurement systems for determining the mirror positions. An unwanted rise in temperature of that measurement structure is correspondingly more serious as the spacing between the position sensors and the mirrors which rise in temperature in operation of the projection exposure apparatus is relatively small (and for example can be in the range of between 5 and 100 mm).

It is known from US 2005/0018154 A1 to provide in a microlithographic projection exposure apparatus at least one heat shield which is intended to absorb the heat given off by the mirrors and/or the carrier structure thereof, wherein that heat is dissipated by a heat transport circuit which is in mechanical contact with the heat shield.

SUMMARY

The disclosure provides an optical arrangement in a projection exposure apparatus for EUV lithography, which permits the provision of a carrier structure for optical elements of the system in structural space-saving fashion and with simultaneous and flexible implementation of further functionalities which are to be implemented by the projection exposure apparatus.

According to an aspect of the disclosure, an optical arrangement in a projection exposure apparatus for EUV lithography includes:

a multiplicity of optical elements, and
a carrier structure which carries the optical elements and which is composed of at least two releasably interconnected modules,
wherein each module is composed of at least one carrier structure subelement,
wherein a subhousing is produced by a multiplicity of carrier structure subelements and/or modules, and
wherein the subhousing has a geometry that varies, at least in regions, in correspondence to a usable beam path in the projection exposure apparatus, the usable beam path being defined as an envelope of all light bundles which can propagate from all field points in a field plane to an image plane of the projection exposure apparatus.

The disclosure is based in particular on the concept of constructing a carrier structure for carrying the optical elements in modular fashion from the outset so that further functionalities to be implemented by the optical system can be implemented in a structural space-optimizing fashion and so-to-speak 'in one go'. More specifically a carrier structure having the above-described modular construction provides increased flexibility which in turn has the result that functionalities such as for example ensuring protection from contamination can be afforded for the optical elements by the provision of the above-described 'mini-environments' or subhousings or the provision of a heat shield for temperature-sensitive components such as sensors while minimizing or eliminating the desired properties for additional components. In other words the functionalities which are referred to above and possibly further functionalities are already linked together by the construction of the carrier structure.

The disclosure particularly involves combining the aforementioned 'mini-environment', i.e. a close-fitting or 'tight' housing of the usable beam path, with a force frame, i.e. a structure that serves to carry mechanical loads, in particular due to gravity as well as load moments in actuated systems, and to actively carry the mirrors of the optical system. In other words, several carrier structure subelements are joined together in order to thereby form a massive, solid and tight encapsulation of a beam path in operation of the optical system which also absorbs mechanical forces acting on at least one of the optical elements.

The usable beam path in the projection exposure apparatus can be defined as an envelope of all light bundles which can propagate from all field points to the image plane of the projection exposure apparatus. The light bundles usually have a conical or cone-shaped geometry, and the beam path (due to the kidney-shaped geometry of the field) can particularly be kidney-shaped or elliptical. In view of the resulting complex and 3-dimensional overall-geometry of the usable beam path, the inventive arrangement of carrier structure subelements is particularly advantageous, since difficulties in forming the envelope of the usable beam path that would otherwise result from the complexity of the usable beam path can be avoided.

In some embodiments, openings in the respective carrier structure subelements can be formed as conical or cone-shaped bores that may serve as segments of the enclosure or environment, respectively, of the beam path. Moreover, the carrier structure subelements can also have different sizes or dimensions, such that several carrier structure subelements may e.g. end up at positions where mirrors are to be mounted in order to build up the optical system. In other words, at least one of the carrier structure subelements may have a reduced cross-sectional size compared to other carrier structure subelements, whereby a mounting position of one of the mirrors is provided.

The carrier structure subelements can furthermore be configured such that folded beam paths or beam paths in which light rays propagate, at least region-wise, back and forth on their way to the image plane can be 'encapsulated' in an at least almost optimum manner.

In particular, for example, in comparison to a carrier structure which is rigid or which is established from the outset, the modules according to the disclosure can already be designed with a specific aim in mind that apertures or openings for the beam passage which takes place in operation of the optical system are already adapted to the beam configuration, that is to say the carrier structure in the finished condition of being assembled from the modules already precisely allows the beam to pass through, in a structural space-optimizing fashion, without a proportion worth mentioning of unused structural space remaining. In that respect in particular it is also possible to build up the above-mentioned 'mini-environments' in one go without separate separating walls or housing portions being desired for that purpose.

In addition, as regards the heat shield which was referred to in the opening part of this specification and which is generally also desired, the modular structure can be used for example at the same time from the outset to provide cooling passages serving for example as the heat shield insofar as the carrier structure subelements can already be formed so that portions of such cooling passages are already integrated so that when the carrier structure subelements are assembled the cooling passages are virtually 'automatically' produced. However, as is also described in greater detail hereinafter, it is also possible in a flexible manner to implement an optimum arrangement and possibly interconnection of those cooling passages and thus suitable multiple utilization of coolant circuits in regard to the specific factors and desired properties in the respective optical system.

In an assembly including a plurality of assembled carrier structure subelements, the individual carrier structure subelements (for example in regard to the surfaces of their inside contours) can be respectively ideally adapted, by virtue of the modular mode of construction, to the demands respectively existing in a specific system, in terms of the reflection of stray light. The choice of the respectively appropriate surface treatment process such as mechanical treatment or coating can be specifically targetedly and selectively adapted to the respective local factors or demands in the optical system. In that respect, in regions of the optical system in which stray light is particularly important, it is possible to apply more complicated and costly surface treatment procedures whereas surfaces in less important regions can be more easily produced or can even be left substantially unmodified.

It is to be pointed out that the optical elements can be carried by the carrier structure both actively and also passively or indirectly (for example in the sense of being carried by actuators which in turn can carry the optical elements such as for example mirrors).

In addition it is to be noted that the disclosure is not limited to optical systems with a heat shield or systems with cooling passages. Rather the modular structure according to the disclosure is also advantageous in optical systems in which such heat shields are not necessary (for example as a consequence of components such as for example sensors not being involved in thermal expansion or because such thermal expansion does not cause any further problem).

In an embodiment at least one of the modules is composed of at least two carrier structure subelements, in particular at least three carrier structure subelements, further particularly at least four carrier structure subelements, thereby providing a further increase in flexibility both in regard to adaptation to the beam path in operation of the optical system and also in regard to the specifically targeted influencing of given regions of the beam path.

In an embodiment, the usable beam path is surrounded by the subhousing such that there is a maximum spacing of not more than 10 mm, more particularly not more than 5 mm, between the usable beam path and the subhousing.

In an embodiment at least one of the carrier structure subelements has at least two openings to permit a beam to pass through in operation of the optical system. In addition at least two carrier structure elements can have a different number of openings to permit a beam to pass through in operation of the optical system, wherein in addition at least two carrier structure subelements can differ in respect of the size and/or positioning of their openings.

In an embodiment the arrangement of the openings is adapted to the configuration of a beam passing through the optical system in operation.

In an embodiment the usable beam path includes light bundles that at least partially penetrate each other.

In an embodiment the usable beam path is a folded beam path.

In an embodiment a beam passing through the optical system in operation traverses in succession different openings in at least one of the carrier structure subelements.

In an embodiment at least two carrier structure subelements have at least region-wise a different surface treatment, for example by mechanical machining, coating or the like, in particular at their inside contour towards the beam path in operation of the optical system. In that way the flexibility of the modular arrangement according to the disclosure can be utilized insofar as the surface can be respectively matched to the local factors and desired properties in the optical system (and for example in regions of the optical system in which stray light is particularly important, more complicated and expensive surface treatment operations can be applied).

In an embodiment at least two carrier subelements have mutually corresponding surface portions which after assembly of the carrier structure subelements form with each other a cooling passage portion through which a cooling medium can flow in operation of the optical system. In that way when the carrier structure is assembled the above-mentioned cooling passages or heat shields can also be provided in one go.

This concept of a cooling passage portion being formed by at least two carrier subelements is not limited to the above discussed aspect of forming a subhousing having a geometry that varies in correspondence to a usable beam path in the projection exposure apparatus, but can also be advantageously realized independently of this aspect. Accordingly, the disclosure, according to a further aspect, also relates to an optical arrangement in a projection exposure apparatus for EUV lithography, including:

a multiplicity of optical elements; and
a carrier structure which carries the optical elements and which is composed of at least two releasably interconnected modules,
wherein each module is composed of at least one carrier structure subelement, and
at least two carrier subelements have mutually corresponding surface portions which after assembly of the carrier structure subelements form with each other a cooling passage portion through which a cooling medium can flow in operation of the optical system.

In an embodiment at least one cooling medium circuit is constructed by a multiplicity of such cooling passage portions. In particular a multiplicity of cooling medium circuits which can be selectively connected together are constructed by a multiplicity of such cooling passage portions. In that way and having regard to the available typically limited supply of cooling medium, it is possible to achieve a heat shielding or an action which is optimally matched in regard to the specific factors and demands in the system.

In an embodiment at least one porous structure is arranged in the region of at least one of the cooling medium circuits, whereby the introduction of flow-induced vibration from the carrier structure into the mirrors or into the actuators carrying those mirrors can be reduced or prevented.

In an embodiment at least two carrier structure subelements are fluid-tightly sealed off relative to each other by way of at least one sealing element. In that way fluid-tight sealing integrity can also be implemented with integration of the cooling passages when connecting the carrier structure subelements themselves, for example by way of simple clamping connections or screws.

In an embodiment the sealing element is in the form of a cover plate, wherein preferably that sealing plate and at least one of the carrier structure subelements are made from the same material. The cover plate can include in particular a plate which covers a cooling passage and which for example can be welded in place. Using identical materials avoids electrochemical potentials which are different from each other (entailing different materials) and electrochemical corrosion caused in connection with the typically electrolytic cooling medium (especially as O-rings which are also possibly provided and which include non-electrically conductive material such as for example rubber also cannot cause any electrochemical corrosion).

The disclosure further concerns a microlithographic projection exposure apparatus including an illumination system and a projection objective, wherein the illumination system and the projection objective has an optical arrangement having the above-described features.

The disclosure further concerns a process for the production of an optical system of a projection exposure apparatus for EUV lithography, wherein the optical system is constructed from a multiplicity of optical elements carried by a carrier structure, and wherein the carrier structure is composed of at least two releasably interconnected modules, and wherein each module is composed of at least one carrier structure subelement. In regard to preferred configurations and advantages of the process reference is directed to the foregoing description in connection with the arrangement according to the disclosure.

Further configurations of the disclosure are set forth in the description, the figures and the claims.

BRIEF DESCRIPTION OF THE DRAWINGS

The disclosure is described in greater detail hereinafter by embodiments by way of example illustrated in the accompanying drawings in which:

FIG. 3 shows a diagrammatic view to illustrate the principle of integration of cooling passages in a carrier structure according to the disclosure.

DETAILED DESCRIPTION OF THE PREFERRED EMBODIMENTS

The concept of the disclosure is firstly described hereinafter with reference to the diagrammatic view showing the principles involved in FIG. 1.

FIG. 1a shows a multiplicity of modules 110, 120, 130, 140 (it will be appreciated that the number thereof as four is only by way of example and can also be higher or lower) which jointly provide a carrier structure 100. The carrier structure 100 carries actively or passively optical elements such as for example mirrors 101, 102 in a microphotolithographic projection exposure apparatus designed for EUV (wherein the carrier structure can be provided in the illumination system and/or in the projection objective of the projection exposure apparatus).

Although two mirrors 101, 102 are shown in the illustrated embodiment that number is also by way of example and can also be higher or lower, in which respect in the case of a carrier structure a projection objective typically involves more (for example six) mirrors. In addition the optical elements or mirrors 101, 102 can also be carried indirectly, for example by way of actuators which in turn carry those mirrors (the actuators are not shown in FIG. 1 for the sake of simplicity).

Figure 1:
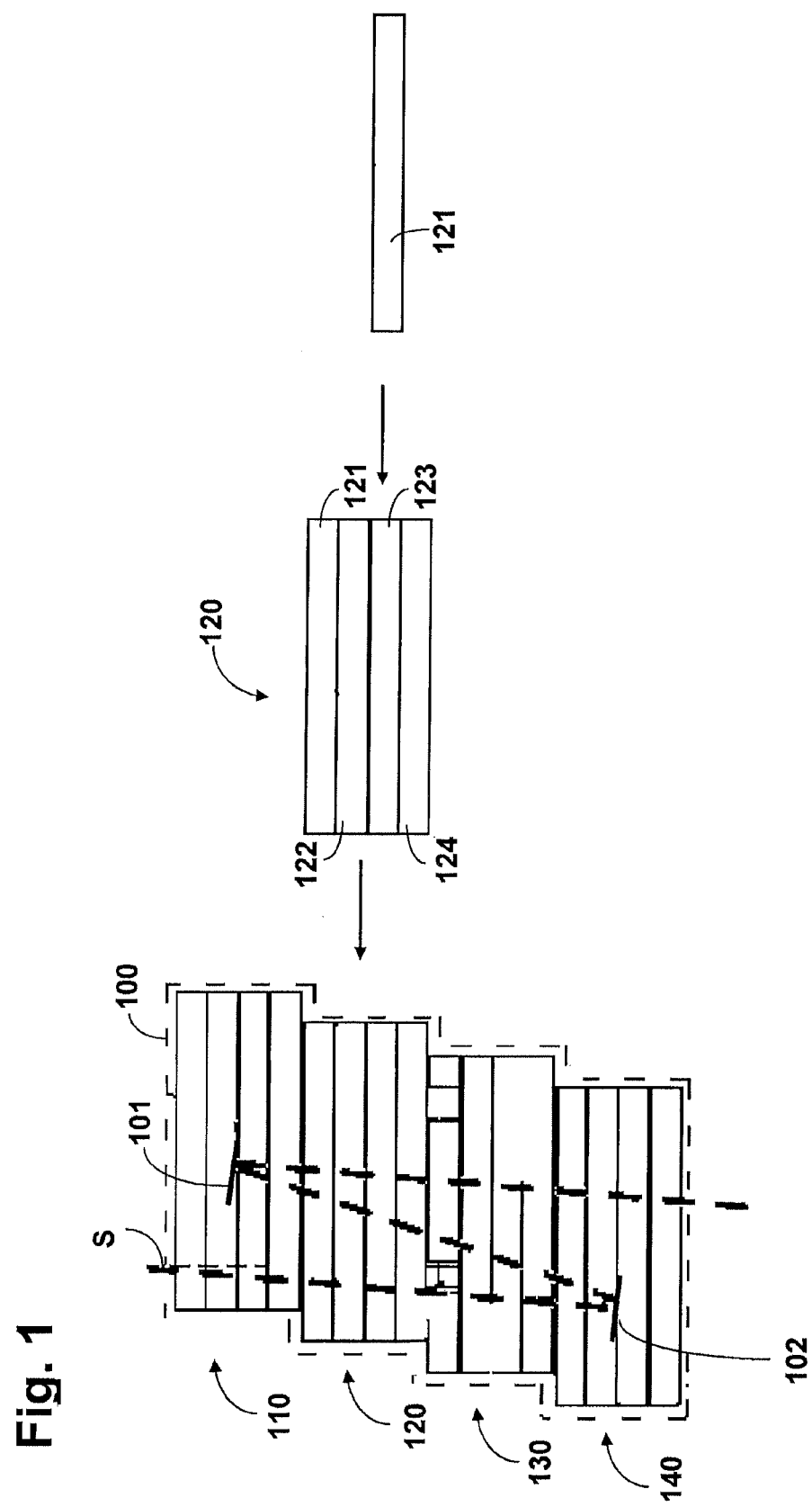
FIG. 1 shows a diagrammatic view to illustrate the principle of the structure of an optical arrangement in accordance with an embodiment of the disclosure.

In the only diagrammatic view in principle in FIG. 1 each of the modules 110-140 is composed of four carrier structure subelements (for example the carrier structure subelements 121-124). That number is only by way of example and can be higher or lower and can also be different for the individual modules 110-140.

The material of the carrier structure 100 can have or be for example a suitable metal, steel or an aluminum alloy, wherein the modules 110-140 can also be made from different materials. In addition the carrier structure subelements (for example 121-124), as described in greater detail hereinafter, can be joined together by way of different production processes to afford the modules 110-140. Vacuum brazing, diffusion welding, clamping connection, screw connection and welding are particularly suitable. In that respect the connecting technology involved supports the demands for sufficiently high inherent frequency, damping and thermal conduction.

The modules 110-140 can also be produced for example by welding plates or facets which can also be curved in a plate (possibly flexural) welded construction, to which in turn the cooling passages (to be described in greater detail hereinafter) can be applied (for example welded or soldered thereon), in which case the modules produced in that way are in turn connected together (for example by screwing).

The modules 110-140 and carrier structure subelements according to FIG. 1 can be configured such that they form a subhousing having a geometry that varies, at least in regions, in correspondence to a usable beam path in the projection exposure apparatus. More particularly, the usable beam path can be surrounded by the subhousing such that there is a maximum spacing of not more than 10 mm, more particularly not more than 5 mm, between the usable beam path and the subhousing. Furthermore, a folded beam path which is schematically shown in FIG. 1 can be 'encapsulated' by the subhousing in an at least almost optimum manner.

Figure 2:
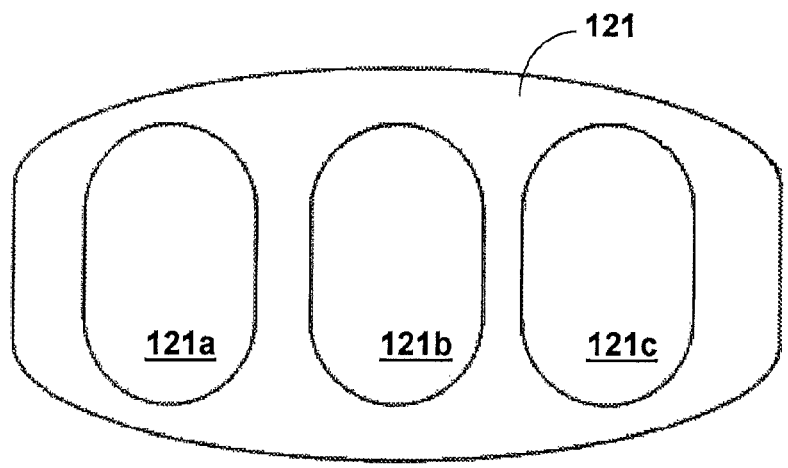
FIG. 2 shows a diagrammatic plan view of a carrier structure subelement by way of example which can be used in the carrier structure of the FIG. 1 arrangement.

FIG. 2 shows a diagrammatic plan view of a carrier structure subelement 121 by way of example which can be used in the carrier structure according to the disclosure as shown in FIG. 1. In this example the carrier structure subelement 121 has in all three openings 121*a*, 121*b* and 121*c* as apertures for the beam to pass through. In this case the openings 121*a*, 121*b* and 121*c* are so selected in respect of their geometry, arrangement and number in accordance with the ultimately intended placement of the respective carrier structure subelement 121 in the beam path so that when the carrier structure subelements or the modules in turn composed therefrom are joined together, the desired encapsulation of the light beam passing through the optical system in operation thereof or optionally the provision of the above-described 'mini-environments' is afforded.

Thus the regular or symmetrical arrangement of the openings or apertures 121*a*, 121*b* and 121*c*, shown in the example of FIG. 2, is simplified as those openings are preferably so arranged at the respective positions of the beam passage therethrough that optimum geometrical approximation to the beam path is achieved. In general terms the carrier structure subelements, both in regard to their outside contour and also in regard to their inside contour, are thus of a geometry which is more complex for example in comparison with a round disk but also compared to the carrier structure subelement 121 illustrated in the embodiment by way of example. As is already apparent from FIG. 1 that implies that carrier structure subelements with fewer openings or apertures are already provided in the simplified beam path diagrammatically shown there, depending on how often the beam path passes through the respective carrier structure subelement.

In addition the surfaces that can be seen in FIG. 2 of the inside contour of each carrier structure subelement, by virtue of the modular structure, can be respectively ideally adapted to the demands in regard to reflection of stray light, insofar as respectively suitable surface treatment processes such as mechanical machining (for example for definedly roughening the surface to reduce or eliminate reflection phenomena) or coating in a suitable fashion are selected.

The internal geometry (which in fact at the same time also forms a 'mini-environment' within the optical system) can thus be individually produced, in which respect for example for specifically targetedly influencing the stray light properties in regions in which stray light is particularly important, it is possible to apply more complex and expensive surface treatment operations and surfaces in less important regions can be more easily produced or even left substantially unchanged.

Upon assembly of the carrier structure subelements to afford the carrier structure for example in FIG. 1 the individual carrier structure subelements on the one hand can firstly be provided with the suitable openings and then stacked in mutually superposed relationship (and joined with the processes still described hereinafter), in which case that gives a stepped surrounding wall configuration for the beam to pass through, determined by the shape or plate geometry of the carrier structure subelements. Alternatively a plurality of carrier structure subelements can firstly be stacked in mutually superposed relationship to constitute the carrier structure before then the corresponding openings are produced for the beam to pass through.

With reference to FIGS. 3 through 6 different possible ways of integrating cooling passages into the carrier structure are described hereinafter.

In per se known manner the fundamental purpose of such cooling passages, in a projection exposure apparatus designed for EUV, is to shield the thermal stresses which are involved with the radiation-induced rise in temperature of the mirrors and which occur in the region of the carrier structure from temperature-sensitive elements such as for example sensors. In regard to that heat shielding effect the modular configuration of the cooling passages according to the disclosure is also found to be advantageous in many respects, as described hereinafter.

Figure 4:
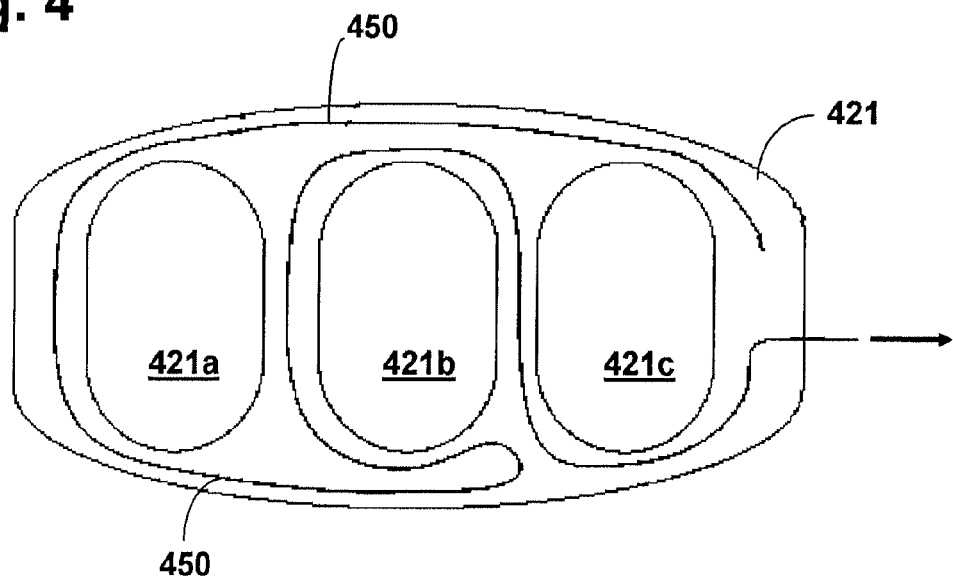
FIG. 4 shows a diagrammatic plan view of a carrier structure subelement by way of example which can be used in the FIG. 3 carrier structure, with incorporated cooling passage.

Firstly, as indicated in the diagrammatic view in FIG. 4, an implementation of cooling passages 450 of a comparatively complex configuration can be substantially reduced to two-dimensional structures insofar as cooling passages 450 are firstly produced for example by milling in the above-described carrier structure subelements 421 and are then closed by welding on cover plates.

In addition, individual placement of the cooling passages within the carrier structure can also be effected for the purposes of specifically targeted control of thermal stresses in the optical system.

In that respect FIG. 3 firstly shows a diagrammatic view in which associated with each of the modules 310-340 is its own or separate cooling circuit 315, 325, 335 and 345 respectively.

Now in further embodiments those cooling circuits can also be individually interconnected within the carrier structure. For example in a modification of the FIG. 3 embodiment, cooling medium (for example water) which flows into the uppermost module 310 can be further used by interconnection with the lowermost module 340 in order to connect the modules 310, 340 together to form a single common cooling circuit, for example if they have to bear only comparatively slight thermal stresses. In addition, only one cooling circuit or also a plurality of cooling circuits can be associated with each module. The cooling circuits can therefore be placed individually in those regions where they are most desired so that those regions are supplied especially with cooling water. In that way, and having regard to the available typically limited supply of cooling medium, it is possible to achieve an action or heat screening effect which is optimally matched in regard to the specific factors or desired properties involved.

A first embodiment relating to the integration of cooling passages in the carrier structure is described hereinafter with reference to the diagrammatic view in FIG. 5.

Figure 5:
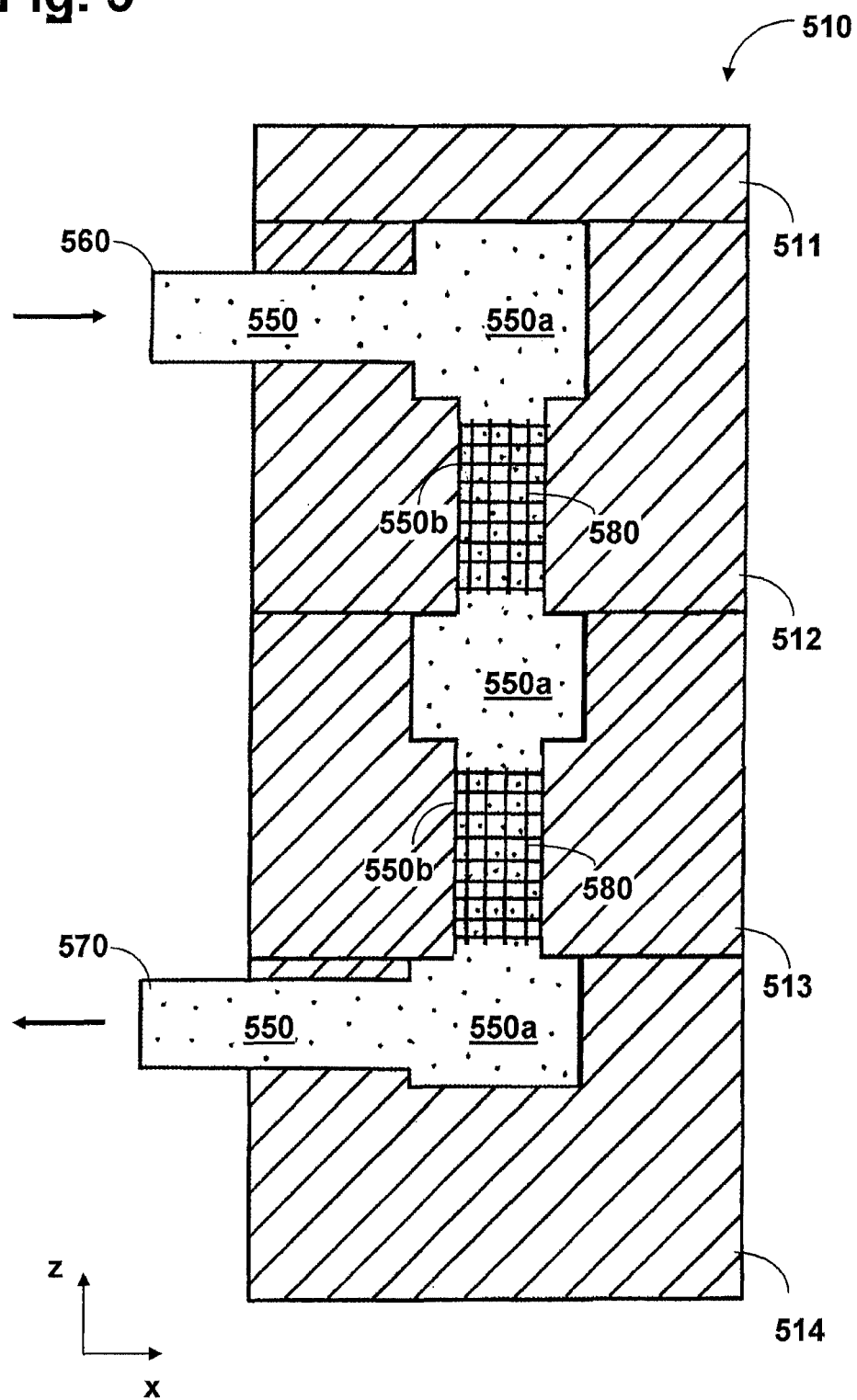
FIG. 5 shows a diagrammatic view to illustrate an embodiment relating to the connection of carrier structure subelements to afford a carrier structure with integrated cooling passages.

Referring to FIG. 5 the carrier structure subelements 511-514 (which are assembled to afford a module 510 similarly to FIG. 1) are joined together by a connection involving intimate joining of the materials involved, insofar as after the carrier structure subelements 511-514 have been produced for example from aluminum or steel and after the regions for the cooling passages have been milled therein (of for example rectangular, round or oval cross-section) in the flat surfaces thereof, the mutually facing boundary surfaces of the carrier structure subelements 511-514 are subjected to hard-vacuum brazing for sealing them off relative to each other and for achieving adequate sealing integrity in relation to the external (typically vacuum) environment of the cooling passages. A further suitable method of sealingly connecting the carrier structure subelements 511-514, which is advantageous in regard to corrosion aspects which are considered in greater detail hereinafter, is diffusion welding in which the carrier structure subelements 511-514 are welded directly on to each other.

The monolithic modules 510, . . . which are accordingly obtained as described hereinbefore can then be screwed together to construct the carrier structure, similarly to FIG. 1.

In the FIG. 5 structure cooling medium 550 (for example cooling water) flows by way of a cooling medium feed 560 to the module 510 and is discharged again from the module 510 by way of a cooling medium discharge 570, in which respect the cooling passages extending in the direction of the plane of the paper (that is to say in the y-direction in the illustrated co-ordinate system) are denoted by '550a' and the through passages connecting those cooling passages 550a together in the z-direction are denoted by '550b'.

Preferably in that respect, in accordance with a further aspect of the disclosure, the configuration of the flow of cooling medium is implemented through the cooling passages 550a and the through passages 550b in such a way as to optimize the flow, with the aim of if possible not inducing any vibration from the carrier structure into the mirrors or into the actuators carrying the mirrors.

As a suitable measure for that purpose, the cooling passages 550a are as far as possible embodied without any bends in the flow path, as can be seen for example in FIG. 4 by the cooling passage 450 indicated there. In order to counteract vibrations caused by eddies which nonetheless possibly occur, preferably the cooling passages 550a are implemented, particularly at the transitions between adjacent carrier structure subelements 511-514, with comparatively large radii or cross-sectional areas as the flow speed is lower in the larger volumes afforded thereby.

As a further suitable countermeasure in regard to flow-induced vibration to be avoided, flow rectifiers 580 in the form of porous structures (for example honeycomb structures, filter structures of porous materials or the like) are preferably incorporated (in particular in the passages 550b interconnecting the cooling passages 550a).

Figure 6:
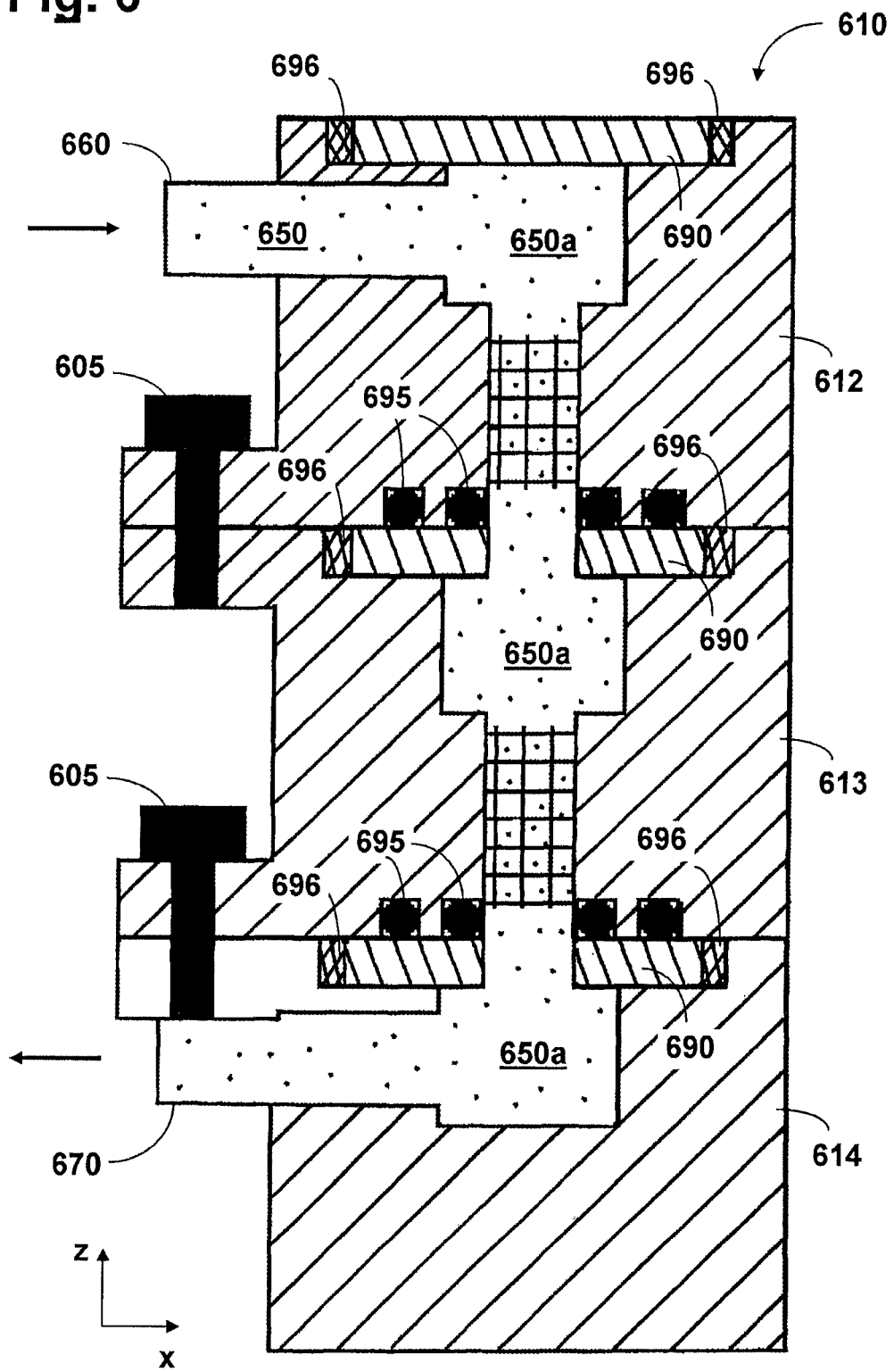
FIG. 6 shows a diagrammatic view of a further embodiment relating to the connection of carrier structure subelements to afford a carrier structure with integrated cooling passages.

FIG. 6 shows a further embodiment relating to the connection of carrier structure subelements to form a carrier structure with integrated cooling passages.

As shown in FIG. 6 carrier structure subelements 612-614 (assembled similarly to FIG. 1 to form a module 610) are screwed together by way of screws 605. As that screwed connection only produces a clamping connection which is not fluid-tight in relation to the flow of cooling medium, sealing closure of the cooling passages 650a (which for example are again pre-milled) is then effected by way of sealing plates 690 which in turn are linked into the respective carrier structure subelements 612-614 by way of welded seams 696. A sealing effect at the transitions between the respective sealing plate 690 and the respectively adjoining carrier structure subelement 612-614 can be achieved by a further seal (which in the embodiment is in the form of a double O-ring seal 695).

The embodiment shown in FIG. 6 is advantageous in particular in regard to corrosion aspects as identical materials (for example aluminum) can be used for production of the sealing plates 690 and the carrier structure subelements 612-614 and in addition the welding operations involved in making the connection can also be carried out without additional materials so that the cooling passages can be produced substantially using one and the same material. Thus it is possible in the region of the cooling passages to at least substantially avoid the presence of different (for example soldering) materials with mutually different electrochemical potentials and electrochemical corrosion which is also involved therewith and with the typically electrolytic cooling medium. A further measure for reducing electrochemical corrosion within the cooling passages involves at least region-wise nickel-plating of the cooling passages.

A further possible method of applying the cooling passages includes laying on a foil (which preferably includes the same material as the sheet material, for example steel or aluminum and which can be produced with a thickness, purely by way of example, of between 0.5 mm and 1 mm) which is fixed both at its periphery and also at suitable support points (for example by welding) and which is plastically deformed by way of the action of pressure to provide foils which are shaped in cushion form, the resulting cooling passages being provided with suitable connections for passing a cooling medium therethrough.

It will be appreciated that different joining methods for joining the carrier structure subelements or modules together according to the disclosure to provide the carrier structure according to the disclosure can be used in combination, in which respect for example individual modules are milled out of solid material blocks (possibly with cooling passages being milled into the surface of the modules and with sealing joining using soldering or welding processes) and other individual modules including (possibly curved) facets are joined using soldering or welding processes, in which case the cooling passages can be welded or soldered on.

Even if the disclosure has been described by reference to specific embodiments numerous variations and alternative embodiments will be apparent to the man skilled in the art, for example by combination and/or exchange of features of individual embodiments. Accordingly it will be appreciated by the man skilled in the art that such variations and alternative embodiments are also embraced by the disclosure and the scope of the disclosure is limited only in the sense of the accompanying claims and equivalents thereof.

What is claimed is:

1. An optical arrangement, comprising:
a plurality of optical elements; and
a carrier structure carrying the optical elements, the carrier structure comprising at least first and second releasably interconnected modules, the first module comprising at least one carrier structure subelement, the second module comprising at least two carrier structure subelements,
wherein:
the optical arrangement is configured so that, during use of the optical arrangement, useable light follows a beam path that intersects the plurality of optical elements;
at least one carrier structure subelement comprises a solid material having an outer perimeter;
the solid material defines a first opening in the at least one carrier structure subelement;
the first opening is surrounded by the outer perimeter of the solid material;
the solid material defines a second opening in the at least one carrier structure subelement;
the second opening is surrounded by the outer perimeter of the solid material;
the solid material extends between the first and second openings;
the beam path intersects the first and second openings; and
the beam path passes through the first opening before the beam path intersects at least one of the optical elements.

2. The optical arrangement of claim 1, wherein, at the location where the beam path passes through the first opening, there is a maximum spacing of at most 10 millimeters between the beam path and an outer perimeter of the first opening.

3. The optical arrangement of claim 1, wherein the second module comprises at least three carrier structure subelements.

4. The optical arrangement of claim 1, wherein the at least two carrier structure subelements have a different number of openings, and the beam path intersects the openings in the at least two carrier structures.

5. The optical arrangement of claim 1, wherein:
each of at least two carrier structure subelements has an opening;
the beam path intersects the opening in each of the at least two carrier structure subelements; and
the opening in each of the at least two carrier structure subelements differs from each other with respect to a size, a cross-sectional geometry and/or a positioning.

6. The optical arrangement of claim 1, wherein the beam path is a folded beam path.

7. The optical arrangement of claim 1, wherein the beam path intersects the second opening after the beam intersects the first opening.

8. The optical arrangement of claim 1, wherein the plurality of optical elements comprise mirrors.

9. The optical arrangement of claim 1, wherein the carrier structure subelements have at least region-wise a different surface treatment.

10. The optical arrangement of claim 1, wherein at least two carrier structure subelements have mutually corresponding surface portions defining a cooling passage portion configured to have a cooling medium pass therethrough during use of the optical arrangement.

11. The optical arrangement of claim 1, further comprising a sealing element which seals at least two carrier structure subelements from each other in a fluid-tight manner.

12. The optical arrangement of claim 11, wherein the sealing element comprises a cover plate.

13. The optical arrangement claim 12, wherein at least one carrier structure subelement and the cover plate comprise the same material.

14. An apparatus, comprising:
an illumination system; and
a projection objective,
wherein the projection objective comprises the optical arrangement of claim 1, and the apparatus is an EUV microlithography projection exposure apparatus.

15. The optical arrangement of claim 1, wherein the beam path passes through the first opening before the beam path intersects any of the optical elements.

16. An apparatus, comprising:
an illumination system; and
a projection objective,
wherein the illumination system comprises the optical arrangement of claim 1, and the apparatus is an EUV microlithography projection exposure apparatus.

17. The optical arrangement of claim 1, wherein the beam path passes through the second opening after the beam path intersects the at least one of the optical elements.

18. The optical arrangement of claim 1, wherein, at the location where the beam path passes through the second opening, there is a maximum spacing of at most 10 millimeters between the beam path and an outer perimeter of the second opening.

19. The optical arrangement of claim 1, wherein, for at least one additional carrier structure subelement:
the at least one additional carrier structure subelement comprises a solid material having an outer perimeter;
the solid material of the at least one additional carrier structure subelement defines a first opening in the at least one additional carrier structure subelement;
the first opening in the at least one additional carrier structure subelement is surrounded by the outer perimeter of the solid material of the at least one additional carrier structure subelement;
the solid material of the at least one additional carrier structure subelement defines a second opening in the at least one additional carrier structure subelement;
the second opening in the at least one additional carrier structure subelement is surrounded by the outer perimeter of the solid material of the at least one additional carrier structure subelement;
a portion of the solid material of the at least one additional carrier structure subelement extends between the first and second openings of the at least one additional carrier structure subelement;
the beam path intersects the first and second openings of the at least one additional carrier structure subelement; and the beam path passes through the first opening in the at least one additional carrier structure subelement before the beam path intersects the at least one of the optical elements.

20. The optical arrangement of claim 19, wherein the beam path passes through the second opening of the at least one additional carrier structure subelement after the beam path intersects the at least one of the optical elements.

21. The optical arrangement of claim 19, wherein, at the location where the beam path passes through the first opening of the at least one additional carrier structure subelement, there is a maximum spacing of at most 10 millimeters between the beam path and an outer perimeter of the first opening of the at least one additional carrier structure subelement.

22. The optical arrangement of claim 21, wherein, at the location where the beam path passes through the second opening of the at least one additional carrier structure subelement, there is a maximum spacing of at most 10 millimeters between the beam path and an outer perimeter of the second opeing of the at least one additional carrier structure subelement.

23. An optical arrangement, comprising:
a plurality of optical elements; and
a carrier structure carrying the plurality of optical elements, the carrier structure comprising first and second releasably interconnected modules, the first module comprising first and second carrier structure subelements,
wherein:
the optical arrangement is configured so that, during use of the optical arrangement, useable light follows a beam path that intersects the optical elements;
the first carrier structure subelement defines a first opening that the beam path passes through;
the second carrier structure subelement defines a second opening that the beam path passes through; and
an inside contour of the first carrier structure subelement facing the beam path has a first surface treatment which is at least region-wise different from an inside contour of the second carrier structure subelement facing the beam path.

24. An optical arrangement in a projection exposure apparatus for EUV lithography, comprising:
a plurality of optical elements; and
a carrier structure carrying the plurality optical elements, the carrier structure comprising at least two releasably interconnected modules, each module comprising at least one carrier structure subelement, at least two carrier structure subelements having mutually corresponding surface portions defining a cooling passage portion configured to have a cooling medium flow therethrough during use of the optical arrangement,
wherein the optical arrangement is configured to be used in an EUV microlithography projection exposure apparatus.

25. The optical arrangement of claim 24, wherein the optical arrangement comprises a plurality of cooling passage portions defining a cooling medium circuit.

26. The optical arrangement of claim 25, wherein the optical arrangement comprises a plurality of cooling medium circuits connectable by cooling passage portions.

27. An optical arrangement, comprising:
a plurality of optical elements; and
a carrier structure carrying the optical elements, the carrier structure comprising at least first and second releasably interconnected modules, the first module comprising at least one carrier structure subelement, the second module comprising at least two carrier structure subelements,
wherein:
the optical arrangement is configured to be used in an EUV microlithography projection exposure apparatus having a usable beam path defined as an envelope of all light bundles which can propagate from all field points in a field plane to an image plane of the EUV microlithography projection exposure apparatus; and
at least two carrier structure subelements have mutually corresponding surface portions defining a cooling passage portion configured to have a cooling medium pass therethrough during use of the optical arrangement.

* * * * *

UNITED STATES PATENT AND TRADEMARK OFFICE
CERTIFICATE OF CORRECTION

PATENT NO. : 9,298,111 B2
APPLICATION NO. : 13/405882
DATED : March 29, 2016
INVENTOR(S) : Viktor Kulitzki et al.

It is certified that error appears in the above-identified patent and that said Letters Patent is hereby corrected as shown below:

Claims

Col. 12, line 14, Claim 13, after "arrangement", insert -- of --.

Col. 13, line 21, Claim 22, delete "opeing" and insert -- opening --.

Signed and Sealed this
Nineteenth Day of July, 2016

Michelle K. Lee
*Director of the United States Patent and Trademark Office*